United States Patent [19]
McPhee

[11] Patent Number: 5,798,579
[45] Date of Patent: Aug. 25, 1998

[54] HIGH VOLTAGE PULSE GENERATOR

[75] Inventor: Andrew J. McPhee, Bristol, Great Britain

[73] Assignee: Matra BAe Dynamics (UK) Ltd., Hertfordshire, United Kingdom

[21] Appl. No.: 663,547

[22] Filed: Jun. 13, 1996

[30] Foreign Application Priority Data

Jun. 20, 1996 [GB] United Kingdom ............ 9512549

[51] Int. Cl.⁶ ............................................. H02J 17/20
[52] U.S. Cl. ..................... 307/106; 307/108; 307/110; 333/20; 327/100
[58] Field of Search ................... 307/106, 108, 307/109, 110; 333/20, 24 R, 24 C; 331/129; 363/59; 320/1; 318/129, 130; 327/100, 181, 291, 544

[56] References Cited

U.S. PATENT DOCUMENTS

| | | | |
|---|---|---|---|
| 3,845,322 | 10/1974 | Aslin | 307/108 |
| 4,200,821 | 4/1980 | Bekefi | 315/39.51 |
| 4,274,134 | 6/1981 | Johannessen | 363/59 |
| 4,328,461 | 5/1982 | Butters | 374/72 |
| 4,367,412 | 1/1983 | Cheever | 250/492.3 |
| 4,379,977 | 4/1983 | Carmel | 378/136 |
| 4,439,686 | 3/1984 | Cheever | 250/492.3 |
| 5,311,067 | 5/1994 | Grothaus et al. | 307/108 |
| 5,313,487 | 5/1994 | Fujikawa | 372/86 |

Primary Examiner—William M. Shoop, Jr.
Assistant Examiner—Peter Ganjian
Attorney, Agent, or Firm—Nixon & Vanderhye P.C.

[57] ABSTRACT

A high voltage generator including a Marx Generator (1) provides an output of up to 200 kV at a pulse repetition rate of up to 1 kHz. Discharge is triggered by over-volting a first stage (2a) of the Marx Generator, each stage including a hydrogen spark gap switch (5). By inhibiting the charging power supply (7) for a short time after each discharge, recovery of the dielectric is ensured, enabling high repetition rates without the need for gas flow.

9 Claims, 2 Drawing Sheets

HIGH VOLTAGE PULSE GENERATOR

BACKGROUND OF THE INVENTION

1. Field of the Invention

The invention relates to improvements in generators, of the type commonly known as Marx generators, for producing high voltage pulses.

2. Discussion of Prior Art

All known Marx generators operate by charging a series of N capacitor stages in parallel through appropriate impedances to a voltage of $V_O$. Subsequently, the capacitor stages are discharged in series through N switching elements e.g. spark gaps to produce an output voltage of $NV_O$. This sequence can be repeated to give a stream of high voltage pulses.

One example of a Marx generator is described in U.S. Pat. No. 5,311,067. The generator disclosed therein is contained within a high pressure hydrogen gas environment and discharge is initiated by a high rise-time pulse which is applied to the first stage switching element. Disadvantageously, this method of triggering requires the added complication of additional pulse generating circuitry and timing and control circuitry.

SUMMARY OF THE INVENTION

According to this invention, a high voltage pulse generator comprises; a Marx generator having N stages, each stage being provided with a spark gap switch, a charging power supply connected across a first stage of the Marx generator, and characterised by means for periodically inhibiting the action of the charging power supply.

For operation at high repetition rates, the preferred dielectric for the Marx generator is pressurised hydrogen gas. Hydrogen gas is the preferred dielectric as opposed to other gases because the inventors have discovered that good voltage stability can be achieved at high pulse rates.

The breakdown voltage of the first stage spark gap can be set lower than that of the rest either by making the gap smaller or by lowering the pressure of the insulating gas surrounding the gap with respect to the remaining spark gaps. In this way, the Marx generator of the present invention can be triggered without the need for any additional circuitry.

Inhibiting the action of the power supply for a short time after discharge of the Marx generator, enables recovery of the dielectric. One way of achieving this is to chose a power supply which is capable of being inhibited. For example, the use of a capacitor charging supply rather than a conventional DC High Voltage supply is suggested. This type of capacitor charging supply is currently available from several manufacturers and is also capable of operating at high reptition rates.

Optionally, the means for periodically inhibiting the power supply can be driven by circuitry which detects the point at which discharge occurs in the Marx generator.

Continuous application of the charging voltage to a Marx generator results in degradation of the dielectric (e.g. hydrogen gas) with each discharge, resulting eventually, in the worst case, with the spark gaps continually conducting. This effect can be mitigated by gas flow so that ions and other impurities are swept away from the vicinity of the spark gaps. In the present invention however, because the charging of the Marx generator is inhibited between discharge pulses (for 100 μs or so), the hydrogen gas dielectric has time to recover before commencement of the next charging cycle. Thus there is no requirement for gas flow and the generator is operable for up to 10 seconds at repetition rate of at least 1 KHz.

BRIEF DESCRIPTION OF THE DRAWINGS

An embodiment of the invention will now be described, by way of example only, with reference to the drawings of which.

DETAILED DISCUSSION OF PREFERRED EMBODIMENTS

Figure 1:
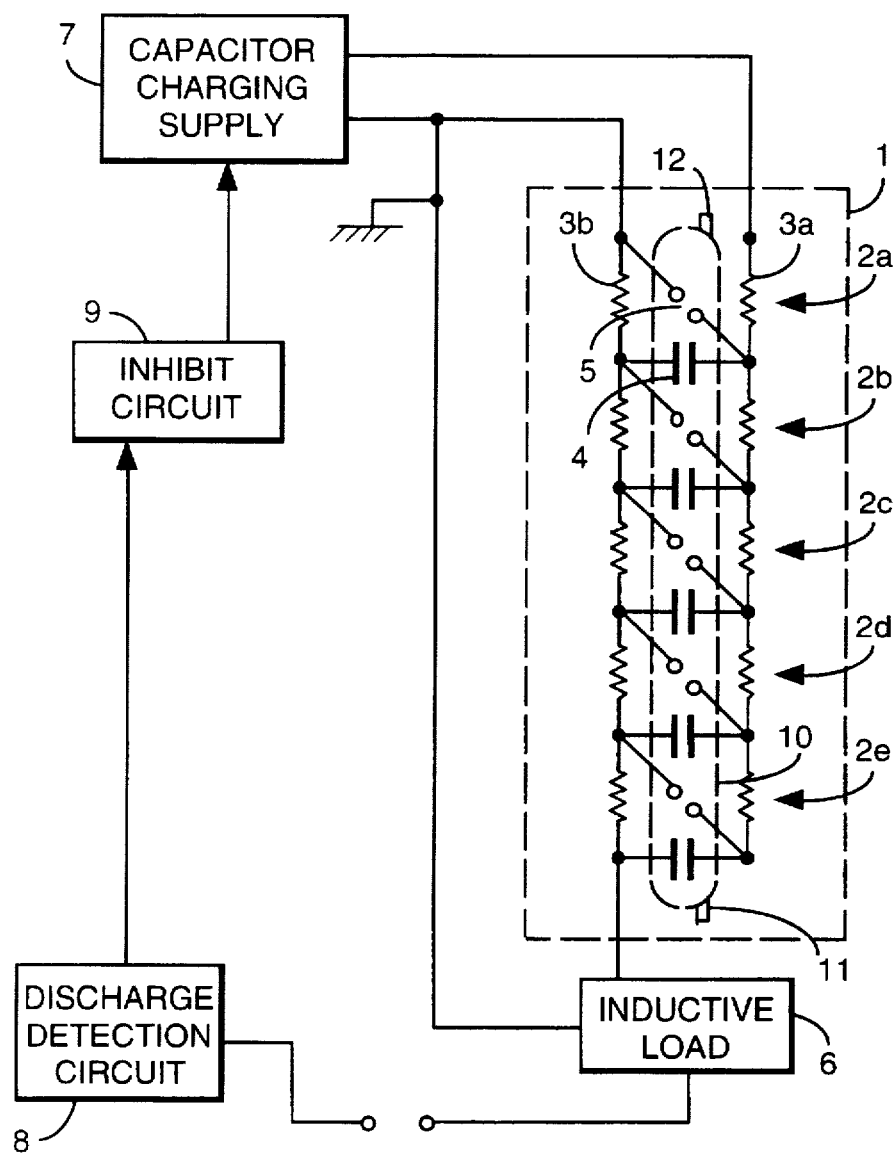
FIG. 1 is a schematic diagram of a high voltage pulse generator in accordance with the invention.

In FIG. 1 a Marx generator 1 comprises five capacitor stages 2a–2e connected in parallel, each stage comprising a charging resistor 3a and an isolation resistor 3b, a capacitor 4 and a spark gap switch 5. An inductive load 6 is connected across the final stage 2e and a capacitor charging supply 7 is connected to the first stage 2a. The spark gap 5 of the first stage 2a is smaller than the rest to ensure that the first stage 2a breaks down first.

A Discharge Detection Circuit 8 is coupled to the load 6 and its output drives an Inhibit Circuit 9 which, in turn, controls the Capacitor Charging supply 7.

The spark gap switches 5 are sealed within an enclosure 10 which is provided with gas fittings 11 and 12 so that the enclosure 10 can be filled with hydrogen as. The fittings 11, 12 are nylon to ensure that any flashover risk around the outside of the enclosure 10 is minimised.

Using currently available components, the High Voltage pulse generator of FIG. 1 can operate at 35 kV per stage (yielding an output of 175 kV) at a pulse repetition rate of 1 kHz.

The capacitance of each stage has a value of 4000 pF which can be achieved by connecting two TDk UHV-12 2000 pF capacitors (rated at 40 kV) in parallel. These capacitors are ceramic and have been found to be well suited to this application. The output capacitance of the Marx generator is thus 800 pF which is sufficient to make stray capacitances almost insignificant, thereby resulting in minimal energy loss.

Another suitable capacitor is the Maxwell 37335 which can operate at 70 kV. The Maxwell and TDk capacitors can operate at energy densities of $33 JI^{-1}$ and $30 JI^{-1}$ respectively.

Ideally, to ensure maximum energy density and to reduce electrical stress on the high voltage connections, the capacitors should be contained in half-millstone shaped insulated sections.

A further consideration with capacitors is the loss tangent. This deviation from 90° between the voltage and current manifests itself as a heating of the capacitor, leading to losses. The TDk capacitors are known to perform well in this respect at least up to a 100 kHz pulse rate.

In the exemplary embodiment, each resistor 3a and 3b is a carbon composite type having a value of 2 kΩ. Wire wound resistors could be used but their inherent inductance slows down operation of the Marx generator and contributes to losses. Furthermore, they can be susceptible to failure at high voltages. The inventors are aware that some Marx generators employ Copper Sulphate solution resistors due to their good high voltage performance. However their drawback is their high degree of temperature dependence owing to their aqueous state. In contrast carbon composite and wire-wound resistors have relatively stable thermal properties and are therefore preferable if the Marx generator is required to operate under varying temperature conditions.

Flashover along the resistor bodies is prevented by the use of a suitable potting compound. Alternatively, the surrounding area could be pressurised with air, nitrogen or sulphur hexafluoride, or could be oil-insulated.

The chosen value of 2 k$\Omega$ per stage has been calculated to result in a 2% energy loss for the 5 stage Marx generator. Choosing a lower resistance value would increase the loss, whereas higher values would slow down the charge cycle.

Another factor to consider in the design of the Marx generator 1 of FIG. 1 is the optimum ratio of the Marx generator capacitance $C_1$ to load capacitance $C_2$. To address this aspect, it is useful to consider two functions of resonant circuits.

These two functions are maximum energy transference and maximum voltage on load.

The energy transference $\eta$ between two capacitors is given by the following relationship $$\eta = \frac{4C_1C_2}{(C_1+C_2)^2}.$$

Figure 2:
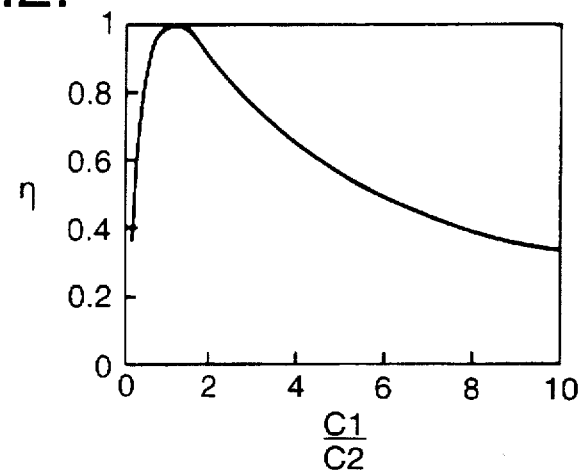
FIG. 2 is a graph illustrating energy transference between two parallel capacitors.

This is represented graphically and is shown in FIG. 2.

As can be seen from FIG. 2 the maximum energy transference occurs for equal capacitances.

The inductively peaked output voltage $V_2$ for two parallel resonant capacitors is given from the relationship shown below $$V_2 = \frac{2V_1C_1}{C_1+C_2}$$

where $V_1$ is an input voltage.

Figure 3:
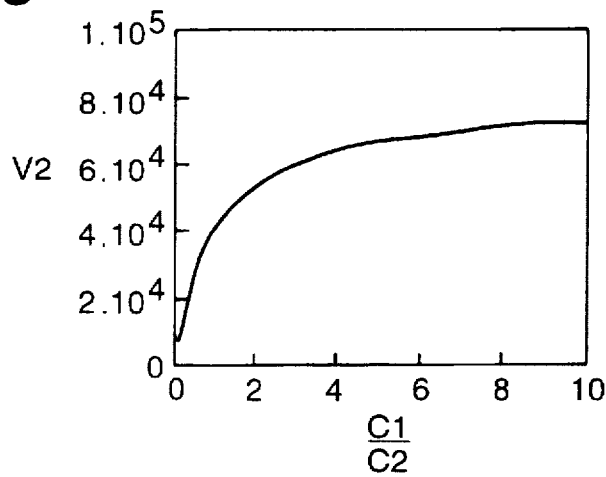
FIG. 3 is a graph showing variation of voltage across a capacitative load.

With two parallel resonant capacitors the voltage across the output $V_2$ is maximised for $C_1 \gg C_2$. This would result in up to twice the charge voltage appearing across the capacitor $C_2$ and is shown in FIG. 3. The compromise position of optimising the energy transference and maximum output voltage can be evaluated by taking the product of these graphs.

The optimised energy/voltage relationship is given in the formula shown below. This is the product of the energy transference equation and the output voltage equation.

$$Q = \frac{8V_1C_1^2C_2}{(C_1+C_2)^3}$$

Figure 4:
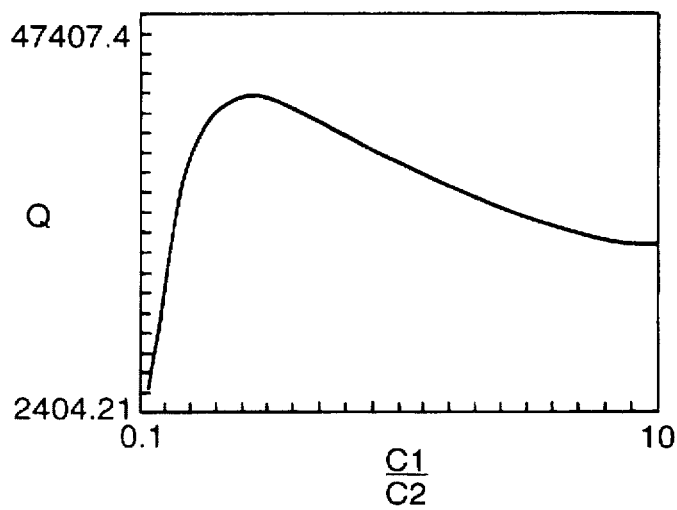
FIG. 4 is a graph illustrating optimum energy/voltage relationships for resonant circuits.

This relationship is shown graphically in FIG. 4.

The spark gaps 5 are constructed in a single spark tube configuration which requires just one input and output gas connection for the whole system and enables cross UV pre-ionisation between adjacent spark gaps.

Adjacent UV pre-ionisation between spark gaps is known to stabilise operation.

Capacitor charging supplies capable of delivering 40 kV at a 1 kHz rate are available from Applied Laser Electronics, e.g. Type ALE802. To ensure that there is sufficient power available to breakdown the Marx generator, the design voltage per stage is 35 kV.

This will also allow for any varying climatic conditions although this should be minimal since the spark gap region is pressurised. This results in an output voltage of 175 kV.

The spark gap 5 of the first stage is configured to breakdown at a voltage just below 35 kV (typically 33 kV) whereas the breakdown voltage for the remaining stages is nominally 35 kV.

As mentioned previously, the spark gap switch enclosure 10 i.e. the spark tube is filled with hydrogen gas which is pressurised up to 15 bar. The gas provides insulation for the spark gaps 5. This pressure sets the minimum spark gaps spacing at around 4 mm for a 35 kV breakdown voltage.

A distance between adjacent stages (2a, 2b e.g.) is set at 60 mm which should be sufficient to ensure that no interstage flashovers occur. The electrodes comprising each switch 5 are nonspherical to enable this distance to be minimised. This will result in a slight degree of field enhancement due to this non-uniformity. However this should not be significant enough to result in flashovers.

In operation, hydrogen gas enters the spark tube 10 at one end and leaves at the opposite end via the gas fittings 11 and 12. This ensures that any air present in the spark tube 10 is purged before pressurisation.

The spark tube 10 is then filled with hydrogen gas to a pressure of 15 bar.

Power from the capacitor charging supply 7 is now applied to the Marx generator whereby each stage charges up to its maximum charging voltage of around 35 vK. When the breakdown voltage of the spark gap 5 of the first stage 2a is reached, the gap 5 closes rapidly. The remaining spark gaps 5 subsequently close through a series of rapid over-voltage transients coupled forward by stray capacitances present in the Marx generator 1. Thus, with all gaps 5 closed, a voltage of 175 kV is transferred to the inductive load 6. At this point, the Detection Circuit 8, which monitors the voltage across the load 6, detects the rising edge of the Marx generator output voltage which signifies that discharge has occurred. In response it triggers the inhibit circuit 9. This results in the inhibit circuit 9 sending a disabling signal to the capacitor charging supply 7 so that the charging voltage is removed from the Marx generator 1 for a set time interval. After this set time interval (typically 200–500 µs) has elapsed, the inhibit circuit 9 removes the disabling signal from the capacitor charging supply 7 and the cycle repeats.

The detection circuit 8 can comprise any appropriate voltage measuring device. Such devices will be easily configured by and known to those skilled in the art.

Similarly, the inhibit circuit 9 can be readily configured by the skilled artisan and could comprise a simple logic circuit incorporating trigger pulse generation and timing circuitry.

In an alternative embodiment, instead of monitoring the voltage across the load 6, the detection circuit monitors the capacitor charging supply output. When discharge occurs this drops to zero whereupon, the detection circuit 8 triggers the inhibit circuit 9. This alternative embodiment may be advantageously employed when the load 6 and possibly the Marx generator 1 also are operated at a location remote from the charging supply 7 and associated circuitry 8, 9.

I claim:

1. A high voltage pulse generator comprising:
   a Marx generator having N stages, where N is an integer, each of said N stages including a spark gap switch having a characteristic breakdown voltage;
   a charging power supply connected across a first of said N stages of the Marx generator; and
   means for periodically inhibiting the action of said charging power supply, wherein said first stage has a lower characteristic breakdown voltage than the characteristic breakdown voltage of the remaining stages.

2. A high voltage pulse generator according to claim 1 in which the width of the gap of the spark gap switch of the first stage is narrower than that of the rest.

3. A high voltage pulse generator according to claim 1 in which the spark gap switches are constructed in a single spark tube configuration and in which the spark tube is filled with pressurised hydrogen gas.

4. A high voltage pulse generator according to claim 1 in which the charging power supply is a capacitor charging supply.

5. A high voltage pulse generator according to claim 1 in which the means for periodically inhibiting the action of the charging power supply is triggered by means responsive to discharge of the Marx generator.

6. A high voltage pulse generator according to claim 2 in which the spark gap switches are constructed in a single spark tube configuration and in which the spark tube is filled with pressurized hydrogen gas.

7. A high voltage pulse generator according to claim 3 in which the pressure of hydrogen gas surrounding the spark gap switch of the first stage is lower than the pressure of hydrogen gas surrounding the spark gap switches of the rest of the stages.

8. A high voltage pulse generator according to claim 2 in which the charging power supply is a capacitor charging power supply.

9. A high voltage pulse generator according to claim 7 in which the charging power supply is a capacitor charging power supply.

* * * * *